US012660674B2

(12) United States Patent
Zetterer et al.

(10) Patent No.: US 12,660,674 B2
(45) Date of Patent: Jun. 16, 2026

(54) HERMETICALLY SEALED GLASS PACKAGE INCLUDING A HEAT-DISSIPATING BASE SUBSTRATE, A CAP, AND A LASER BONDING LINE

(71) Applicant: Schott AG, Mainz (DE)

(72) Inventors: Thomas Zetterer, Landshut (DE); Robert Hettler, Kumhausen (DE); Antti Määttänen, Tampere (FI); Jens Ulrich Thomas, Mainz (DE); Yutaka Onezawa, Otsu (JP); Frank Gindele, Schweitenkirchen (DE)

(73) Assignee: SCHOTT AG, Mainz (DE)

( * ) Notice: Subject to any disclaimer, the term of this patent is extended or adjusted under 35 U.S.C. 154(b) by 664 days.

(21) Appl. No.: 17/665,739

(22) Filed: Feb. 7, 2022

(65) Prior Publication Data

US 2022/0157684 A1      May 19, 2022

Related U.S. Application Data

(63) Continuation of application No. PCT/EP2020/072228, filed on Aug. 7, 2020.

(30) Foreign Application Priority Data

Aug. 7, 2019      (DE) ..................... 10 2019 121 298.7

(51) Int. Cl.
*H10W 74/10*              (2026.01)
*B23K 26/20*              (2014.01)
(Continued)

(52) U.S. Cl.
CPC ......... *H10W 74/127* (2026.01); *B23K 26/206* (2013.01); *B23K 26/24* (2013.01);
(Continued)

(58) Field of Classification Search
CPC ... H01L 23/3142; B23K 26/206; B23K 26/24; B23K 2101/36; B23K 2103/52;
(Continued)

(56) References Cited

U.S. PATENT DOCUMENTS 6,955,975 B2     10/2005  Reichenbach et al.
8,471,289 B2      6/2013  Okayama et al.
(Continued)

FOREIGN PATENT DOCUMENTS

DE          102 35 372 A1      2/2004
DE     10 2017 223 372 A1      6/2019
(Continued)

OTHER PUBLICATIONS

Notification of the Transmission of the International Search Report and Written Opinion of the International Search Authority or Declaration dated Nov. 23, 2020 for International Application No. PCT/EP2020/072228 (14 pages).

*Primary Examiner* — David Chen

(74) *Attorney, Agent, or Firm* — TAYLOR & EDELSTEIN, PC

(57) ABSTRACT

A hermetically sealed package includes: a heat-dissipating base substrate configured for dissipating heat from the hermetically sealed package; a cap arranged on the heat-dissipating base substrate, the cap and the heat-dissipating base substrate jointly forming at least a part of the package; at least one functional area hermetically sealed by the package; at least one laser bonding line configured for (Continued)

hermetically sealing the package, the laser bonding line having a height perpendicular to a bonding plane of the laser bonding line.

22 Claims, 8 Drawing Sheets

(51) Int. Cl.
| | |
|---|---|
| *B23K 26/24* | (2014.01) |
| *H10W 40/25* | (2026.01) |
| *B23K 101/36* | (2006.01) |
| *B23K 103/00* | (2006.01) |

(52) U.S. Cl.
CPC ....... *H10W 40/258* (2026.01); *H10W 40/259* (2026.01); *B23K 2101/36* (2018.08); *B23K 2103/52* (2018.08); *B23K 2103/54* (2018.08)

(58) Field of Classification Search
CPC ........... B23K 2103/54; H10K 50/8426; H10K 59/8722; H10W 74/127; H10W 40/258; H10W 40/259

USPC ...................................... 257/82, 678; 438/26
See application file for complete search history.

(56) References Cited

U.S. PATENT DOCUMENTS

| | | | |
|---|---|---|---|
| 9,748,293 B1 * | 8/2017 | Li ........................... | H04N 23/57 |
| 10,297,787 B2 | 5/2019 | Dejneka et al. | |
| 10,788,370 B2 | 9/2020 | Herrmann et al. | |
| 2006/0130523 A1 * | 6/2006 | Schroeder, III ......... | C03C 3/118 |
| | | | 65/36 |
| 2015/0273624 A1 * | 10/2015 | Yoshida ................ | C03B 23/203 |
| | | | 428/209 |
| 2016/0202425 A1 | 7/2016 | Schroeder et al. | |
| 2018/0033951 A1 | 2/2018 | Shiragami | |

FOREIGN PATENT DOCUMENTS

| | | | |
|---|---|---|---|
| EP | 3 012 059 B1 | | 10/2017 |
| JP | 2011077182 A | * | 4/2011 |
| JP | 2014201452 A | * | 10/2014 |
| WO | 2017/203795 A1 | | 11/2017 |

* cited by examiner

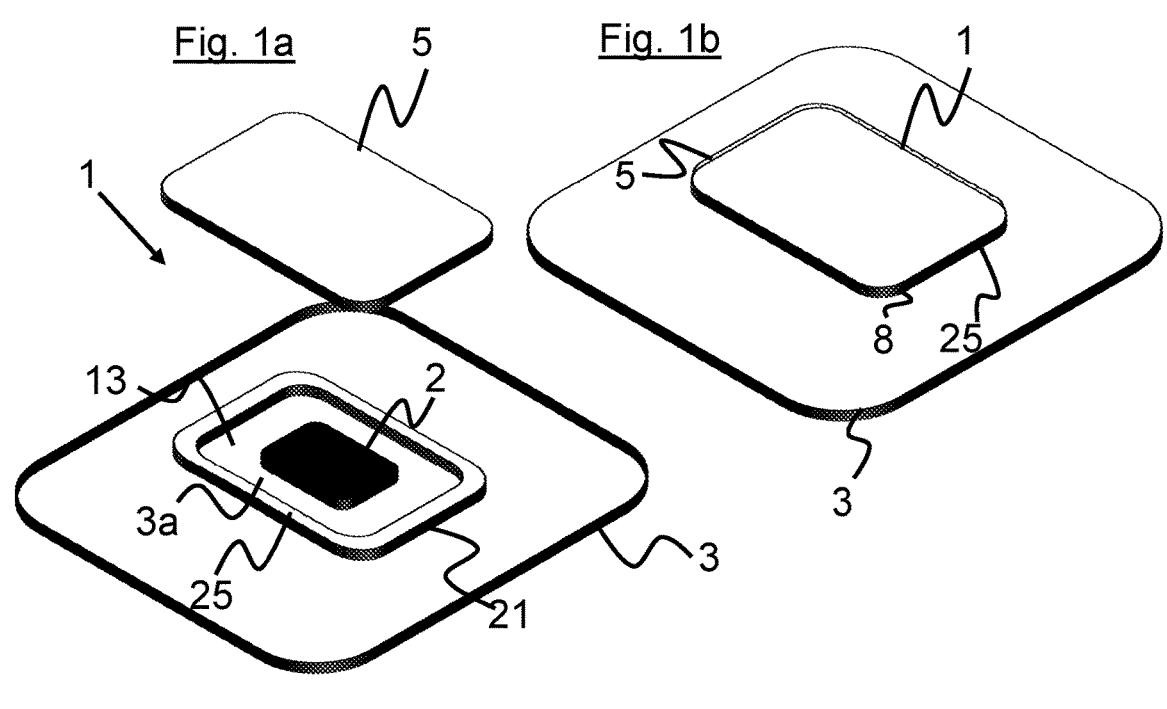
Fig. 1a
Fig. 1b
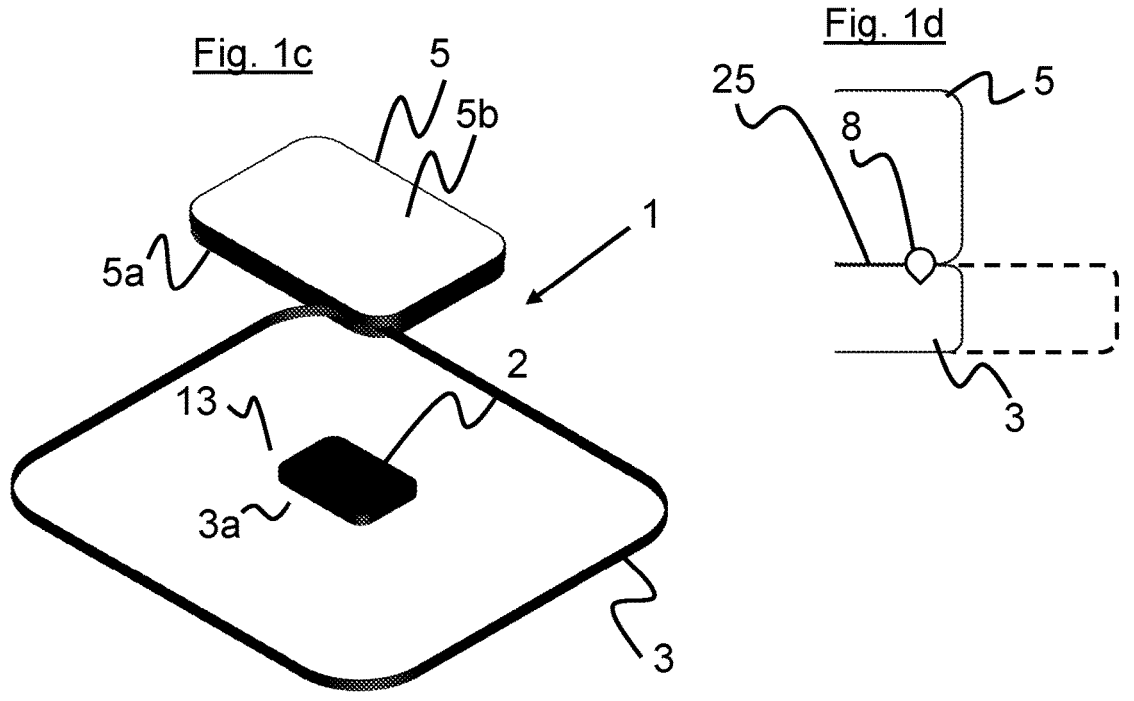
Fig. 1c
Fig. 1d

3 welding line

A     1   5   8   13        B

C                         D functional
area glass cover
(on substrate)

1       5   8

DA   HL

A                           B

14

16     3 functional area
cap (e.g. cavity)

functional area
base substrate toughened layer

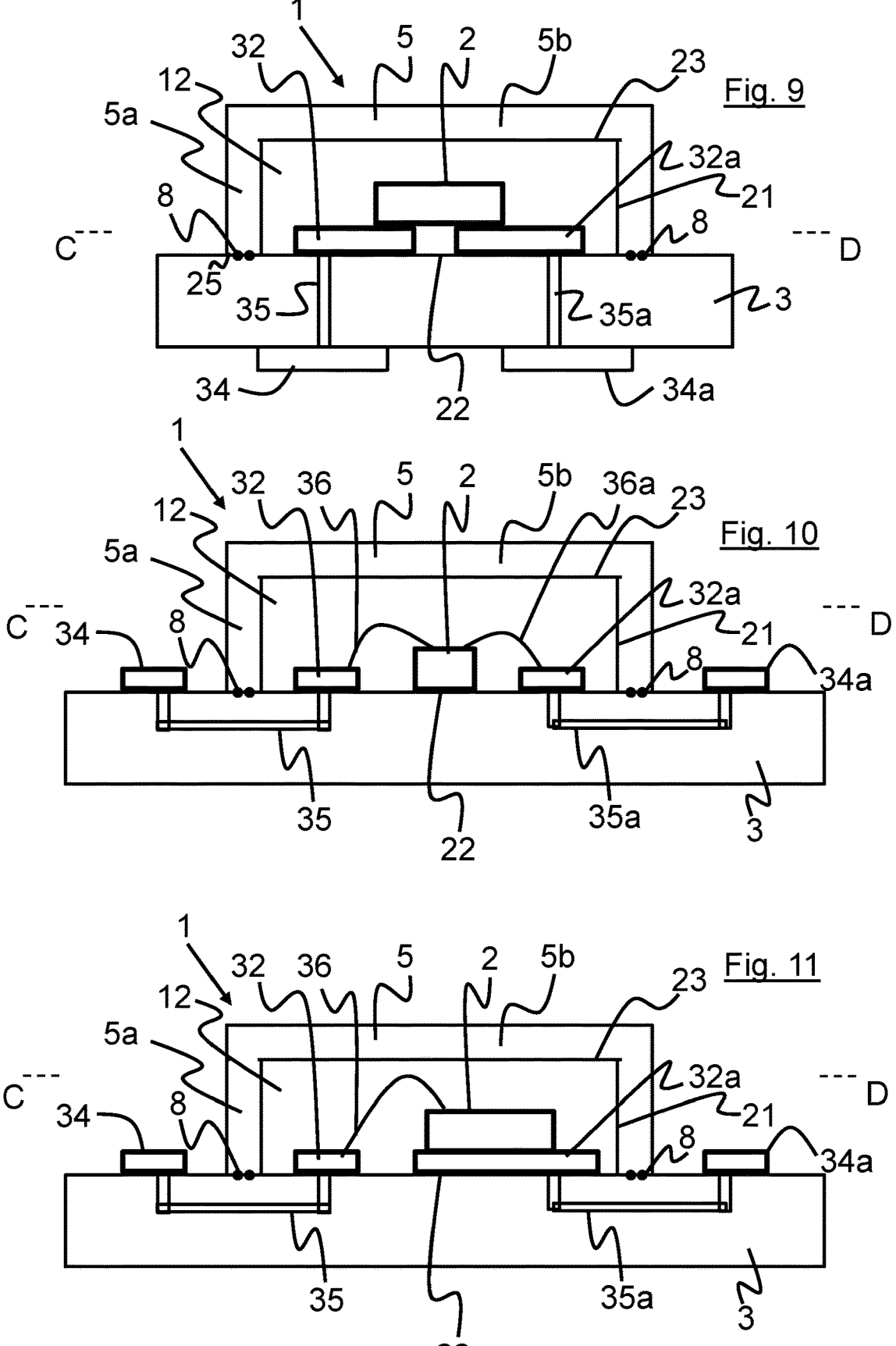

| A | Providing the substrate, with components to be accommodated placed thereon |
| B | Applying the glass caps onto the base substrate |
| C | Laser welding the accommodation cavities |
| D | Separating the wafer / dicing the encapsulations |

HERMETICALLY SEALED GLASS PACKAGE INCLUDING A HEAT-DISSIPATING BASE SUBSTRATE, A CAP, AND A LASER BONDING LINE

CROSS REFERENCE TO RELATED APPLICATIONS

This is a continuation of PCT application No. PCT/EP2020/072228, entitled "HERMETICALLY SEALED GLASS ENCLOSURE", filed Aug. 7, 2020, which is incorporated herein by reference. PCT application No. PCT/EP2020/072228 claims priority to German patent application no. 10 2019 121 298.7, entitled "HERMETICALLY SEALED GLASS ENCLOSURE", filed Aug. 7, 2019, which is incorporated herein by reference.

BACKGROUND OF THE INVENTION

1. Field of the Invention

The invention relates to a hermetically sealed glass package and to a method for providing a hermetically sealed glass package.

2. Description of the Related Art

Hermetically sealed packages, which may also be referred to as enclosures, encapsulations, or housings, can be used to protect sensitive electronics, circuits, or sensors, for example. They allow application of medical implants, for example in the area of the heart, in the retina, or for bio-processors. Bio-processors made from titanium have been known and are being employed.

Sensors can be protected against particularly adverse environmental conditions by a package according to the present invention. This field also includes MEMSs (micro-electromechanical systems), barometers, blood gas sensors, glucose sensors, etc.

Another field of application for a package according to the present invention can be found in a case for a smartphone, in the field of virtual reality glasses and similar devices. A package according to the present invention may also be used for the production of flow batteries, for example in the context of electro-mobility. However, packages according to the present invention can also find application in the aerospace industry, in high-temperature applications, and in the field of micro-optics.

It may be problematic if the sensitive electronics are to be connected to the exterior via electrical connections, or if the electronics to be protected have rather large dimensions, for example including an entire printed circuit board. Although the protection of a larger area such as a printed circuit board is possible, it is cost-intensive and complex.

The aforementioned intended purposes have in common that the electronics are subject to high requirements with regard to their robustness. In order to enable the use of electronics that is not expected to withstand such external impacts, the package must be protected from such adverse environmental influences. Furthermore, there may be the requirement of ensuring an exchange with the interior of the package, i.e. with the cavity defined by the package, for example including electromagnetic radiation, in particular in the visible range and/or in the range of microwave radiation, which means that the package should be transparent at least partially, i.e., at least in sections thereof and/or at least for some range of wavelengths. This transparency allows for communication processes, data or power transfer, measurements of and with the electronics or the sensor disposed in the cavity. In particular optical communication techniques or optical data and power transfer can be possible.

In principle, it has been known to join a plurality of parts and to arrange these parts such that an accommodation area is created in an intermediate space, which can accommodate components. For example, European patent EP 3 012 059 B1 discloses a method for producing a transparent piece for protecting an optical component. A novel laser process is used for this purpose.

What is needed in the art is an improved package for a cavity, such that the cavity is more resistant, thereby allowing enhanced robustness against environmental impacts and also mechanical stress.

SUMMARY OF THE INVENTION

The present invention is considered in the context of improving packages and in particular making them more resistant, thereby allowing to enhance the robustness against environmental impacts and also mechanical stress, for example.

In other words, the present invention provides an improved package for a cavity, in order to withstand even more adverse environmental conditions and impacts or to make the finished packages cheaper to produce. Optionally, the package according to the present invention provides for the use of cheaper components, due to the protective effect it provides.

Thus, another aspect of the present invention includes providing the improvement of the package in a particularly cost-effective, but also reliable and long-lasting way, since the improved package also has to assert itself in the competitive situation on the market.

Yet another aspect of the present invention is based on the finding that in the case of a hermetically sealed package solution, special provisions might have to be made in order to dissipate any heat that might be generated in the package, in particular from power semiconductors. Known highly thermally conductive components can prove to be difficult with regard to bonding them for hermetically sealing them or packages including them.

Thus, in the case of heat generation from the interior of the hermetically sealed package, in particular as generated by power semiconductors inside the package, one aspect of the present invention includes the removal or dissipation of the heat so as to enable consistent operation of the circuit optionally arranged inside the package. Furthermore, thermal aging processes should be reduced and avoided as far as possible.

A hermetically sealed package according to the present invention therefore includes a heat-dissipating base substrate for dissipating heat from the hermetically sealed package. The base substrate is in particular structured or composed such that heat dissipation out of the package is promoted, in particular due to the material of the base substrate and/or its structure or design. With regard to the material of the base substrate, it is taken into account that the hermetic sealing of the functional area is promoted or can be implemented. Optionally, the hermetic sealing can be achieved by coating the base substrate. Optionally, the base substrate itself is structured such that hermetic sealing is achieved by virtue of the material of the heat-dissipating base substrate.

The hermetically sealed package furthermore includes a cap, optionally made of a vitreous, i.e. glassy material, and at least one functional area, in particular a cavity, that is hermetically sealed by, i.e. in the package. The cap is arranged or placed on the base substrate such that it is located over at least a part of or a major portion of the base substrate. Together with the base substrate, the cap forms at least part of the package. In other words, the base substrate and the cap are designed or adapted so as to jointly form a package and so as to be able to enclose a functional area.

The package further includes at least one laser bonding line for hermetically sealing the package. The laser bonding line has a height HL perpendicular to its bonding plane. In other words, the laser bonding line is provided or adapted so as to be capable of bridging gaps in the hermetic sealing of the package, for example by fusing two components to one another by the laser bonding line. In the case where the package only includes the base substrate and the cap for completely enclosing the functional area, the contact area between base substrate and cap, i.e. the interface where the cap and the base substrate engage on each other, is bridged or bonded by the laser bonding line. As a result, the package is formed as an integral piece, with the interface between the components hermetically sealed by the laser bonding line.

The cap optionally includes a vitreous material. Therefore, the cap is optionally transparent or transmissive for at least one wavelength range, for example optically transparent. Depending on the application case, it may also be advantageous if the cap is made to be opaque, i.e. optically non-transparent. Reduced transparency or partial transmittance may also be sufficient for the function. For example, the cap may include glass, glass ceramics, silicon, sapphire, or a combination of the aforementioned materials. In an optional embodiment, the cap is a glass cap, for example made of toughened glass, special glass, high-temperature-resistant glass from the Applicant's product portfolio.

The base substrate in particular includes or is made of a material of high thermal conductivity. The thermal conductivity of the heat-dissipating base substrate is optionally in a range of 100 W/(m*K) or more, optionally 150 W/(m*K) or more, and optionally 170 W/(m*K) or more. A material that is particularly suitable for the structure of the heat-dissipating base substrate is a metallic nitride such as an aluminum nitride ceramic or silicon nitride ceramic.

The at least one laser bonding line optionally circumferentially surrounds the functional area at a distance DF therefrom. In one example, the distance DF around the functional area is consistent, so that the laser bonding line extends around the functional area at approximately the same distance therefrom on all sides. However, depending on the application case, the distance DF may also vary. This might be more favorable from a production technology point of view when a plurality of packages are joined at the same time in one and the same processing step and straight bonding lines or laser bonding lines are produced along the respective contact areas of the individual packages, for example. This may also be the case if the functional area or the package is round or has an arbitrary shape and the laser bonding line hermetically sealing the functional area is drawn in the form of straight lines, for example. In a particular example, the functional area may be in the form of a cavity, and the cavity may in turn have optical properties, for example it may be in the form of a lens, such as a collecting lens, and the laser bonding line may be drawn around the cavity in a pattern differing therefrom.

Optionally, the cap is joined to the base substrate by the laser bonding line. In other words, the cap is placed on or in the base substrate without any intermediate layer and is directly joined to the base substrate by one or a plurality of shared laser bonding lines. In this case, the cap together with the base substrate jointly form the complete package. In other words, no additional or further part is required to form or close the package; rather, the base substrate, the at least one laser bonding line, and the cap together completely seal the functional area or the cavity in a hermetically tight manner.

The functional area is optionally adapted to accommodate at least one accommodation item, such as an electronic circuit, a sensor, or an MEMS. For example, the accommodation item is arranged on the base substrate in the bottom area of the cavity and the cap is arranged over the accommodation item and placed on the bottom of the cavity. In this case, at least one accommodation item is arranged on the base substrate and inside the package.

The at least one accommodation item incudes, for example, a power semiconductor chip, e.g. a GaN LED, a SiC power transistor, GaAs power transistor, or GaN power transistor. Such power semiconductor chips give off a non-negligible amount of heat during operation. In particular when one of the aforementioned accommodation items is arranged inside the cavity, sufficient heat dissipation from the package must be ensured in order to guarantee long-term operation of the one or more accommodation item(s).

If the cap is a cap that is transmissive in the optical wavelength range, for example an optically transparent cap, power supply into the package can be implemented optically, for example via a photovoltaic cell provided inside the package, or via another type of optical receiver for providing electrical power. The package can then be described as a self-sufficient package.

Furthermore, the cap is optionally joined to the base substrate at room temperature. For example, the employed bonding process can be performed at room temperature. Only a negligible amount of heat will then penetrate into the functional area as a result of the joining process, or the amount of heat generated by the joining process can be kept away from the functional area by the heat-dissipating base substrate.

The laser bonding line optionally extends into the material of the cap over a height HL. On the opposite side, the laser bonding line extends into the material of the base substrate, and the heat-dissipating base substrate and the cap are fused to one another. In other words, the material of the base substrate and the material of the cap are mixed during the welding step or in the laser bonding line to produce the firm and non-releasable hermetic bond between the base substrate and the cap.

In another example, an intermediate substrate is arranged between the heat-dissipating base substrate and the cap, and in this example the base substrate is joined to the intermediate substrate in a first bonding plane by at least one first laser bonding line, and the cap is joined to the intermediate substrate in a second bonding plane by at least one second laser bonding line.

Optionally, a marker may be incorporated in the cap, the base substrate, and/or the intermediate substrate.

According to one embodiment of the package, the cap defines an upper side and a laterally circumferential edge of the functional area, and the heat-dissipating base substrate defines a bottom of the functional area, which together completely enclose the accommodation cavity. In this example, the cap is designed so as to laterally extend as far as to the functional area, that is as far as to the lateral side of the at least one accommodation item, for example. In this case the cap has a lateral skirt, for example, on which a top portion of the cap is supported, and the skirt is joined to the base substrate. This embodiment has the advantage that a larger proportion of the surface area of the package includes the optionally transparent material of the cap, and thus a larger proportion of the package is available for any type of communication or exchange with the environment.

On the other hand, according to a further exemplary embodiment, the cap may define the upper side of the functional area, and the heat-dissipating base substrate may define the laterally circumferential edge and the bottom of the functional area, so as to again jointly completely enclose the functional area or the accommodation cavity. In this example, the base substrate extends as far as to the lateral side of the functional area or as far as to the lateral side of the at least one accommodation item. This may be implemented, for example, if the functional area is introduced into the base substrate, i.e. by abrasively hollowing out a recess in the base substrate, for example, so that the functional area and/or the at least one accommodation item is surrounded by the material of the base substrate along the bottom and the lateral side thereof. This embodiment has the advantage that a comparatively larger proportion of the surface area includes the heat-dissipating material of the base substrate so that heat dissipation is improved.

In a further example, the cap may define the upper side of the functional area or cavity, the intermediate substrate may define the laterally circumferential edge, and the heat-dissipating base substrate may define the bottom of the functional area or cavity, which together completely enclose the accommodation cavity.

The package formed at least by a laterally circumferential edge, a bottom and an upper side is optionally at least partially transparent for some wavelength range.

The heat-dissipating base substrate and/or the cap optionally have a thickness of less than 500 μm, of less than 300 μm, of less than 120 μm, or a thickness of less than 80 μm.

The heat-dissipating base substrate may furthermore have at least a first and a second contact, and the first contact is disposed on the bottom of the functional area or the cavity, for example. The second contact may be disposed outside the bottom of the functional area or of the cavity and can be electrically connected to the first contact.

The package optionally has a size of 10 mm×10 mm or less, of 5 mm×5 mm or less, 3 mm×3 mm or less, 2 mm×2 mm, 1 mm×1 mm, or even 0.2 mm×0.2 mm or less. The package is by no means limited to a square footprint, rather a package may also have a size of 10 mm×3 mm or any other shape such as circular or oval. The cap optionally has a height of 2 mm or less. The skirt of the cap has a height of 2 mm or less. On the other hand, the transparent package may also be made larger, depending on the field of application, with several centimeters in length and more being possible. For practical reasons, governed by an optionally fabrication method, which should however not be understood as a size limitation per se, a size limit is simply given by the size of the wafers to be cut. However, the use of wafers for the fabrication is considered to be only one example. For example, it is entirely possible to use glass sheets which can also have larger dimensions than typical wafer dimensions, for producing the transparent package.

Also, a method for providing a hermetically sealed package is presented within the context of the present invention, which package encloses a functional area, in particular a cavity. The functional area or the cavity is enclosed by a laterally circumferential edge, a bottom, and an upper side of the package. An accommodation cavity for accommodating an accommodation item is provided inside the functional area. The method includes the following steps: providing a heat-dissipating base substrate and at least one cap, wherein the cap is transparent at least in some portions thereof and at least for one wavelength range and therefore is a transparent cap; arranging at least one accommodation item on the bottom of the accommodation cavity; arranging the cap on the heat-dissipating base substrate above the accommodation item, thereby creating or forming at least one contact area between the heat-dissipating base substrate and the cap, so that each package has at least one contact area; hermetically sealing the cavities by forming a laser bonding line along the at least one contact area of each package.

In the case where a plurality of packages are efficiently produced jointly in one and the same processing step, the respective package is diced by a cutting or separation step.

The cap optionally incudes a skirt and a top portion, so that the top portion of the cap defines the upper side and the skirt defines at least part of the rim of the accommodation cavity, and wherein the skirt or a contact surface is defined on the end face.

Optionally, the further step of directing the laser beam circumferentially around the functional area is performed, in order to form the laser bonding line, so that the functional area is hermetically sealed circumferentially along the contact area. Optionally, the laser beam can be directed around circumferentially multiple times, and/or optionally a plurality of laser bonding lines can be formed.

A plurality of bottom areas for a plurality of accommodation cavities to be formed may be provided on the heat-dissipating base substrate, and a plurality of caps may be applied to the base substrate in order to form a plurality of packages on the base substrate. In other words, the base substrate will be larger in this case at least in its lateral extension than the dimensions of a package, so that a plurality of later packages share a common base substrate. In this case, the individual packages are obtained by carrying out the additional step of cutting or separating the (large) base substrate such that each package includes a portion of the base substrate. For this purpose, each package defines a bottom on the base substrate, and the base substrate is cut such that the respective bottom remains with the respective package.

Also, a plurality of bottom areas for a plurality of accommodation cavities to be formed may be provided on the base substrate, and a plurality of caps may be applied to the base substrate in order to form a plurality of packages on the base substrate. In other words, a single substrate, such as in particular a printed circuit board, may carry electronics at different points, which are sensitive to such an extent that a plurality of caps are applied on the same substrate, which caps may also have different structures, for example in terms of their shape, height, and size, in order to protect the sensitive electronics while not covering excessive surface area of the substrate. This advantageously allows to save material and to provide a cost-effective method for producing a package, by which sensitive electronics can be protected from external environmental influences. In this case it can be an option to not separate the individual packages afterwards, but rather keep them on the common base substrate.

With at least one of the features listed above, it is possible to produce a package with a hermetically sealed accommodation cavity enclosed therein. A package produced in this way, with a hermetically sealed accommodation cavity enclosed therein, can in particular be used as a medical implant or as a sensor, for example as a barometer.

In the context of the present invention, a method is presented, inter alia, for providing a plurality of hermetically sealed packages. Although the method could be modified without difficulty so as to produce only a single package by this method, it makes sense under economic considerations to produce a plurality of packages in one and the same process sequence. This can save time, effort, and/or raw material.

In other words, to provide a package, a first (base substrate) and at least one second substrate (cap) are provided in a first step, while the at least one second substrate (the cap) includes transparent material, i.e. it is transparent at least in some portions thereof or partially for at least one wavelength range. The cap is optionally arranged directly on the base substrate, that is, for example, the cavity to be sealed is covered by the cap, and the base substrate defines the respective bottom of the respective package. At least one contact area or interface is defined between the at least two substrates, so that each package has at least one contact area. The cavities are then hermetically sealed by bonding the at least two substrates along the contact area(s) of each package, in particular in the contact area along a line at the edge of each package. The packages can advantageously be manufactured together, for example from a common starting substrate, for example in the form of wafers of a wafer stack, or only the base substrate may be provided in the form of a wafer. Subsequently, the method may furthermore include a cutting or separation step for dicing the respective package.

For the purposes of the present application, bottom and upper side is a geometrical construct which may also be any other side with regard to the final orientation of the package. When considering the size of the package and its possible fields of application, it will be obvious that the package can assume any orientation in space during its operation. The terms have been employed to enable easy access to the present invention, and, typically, components are mounted by a machine "from above" nowadays, for example by a gripper. This also leads to the description of the orientation of the sides of the package which, for its fabrication, will optionally be arranged so as to respectively define the bottom to be equipped with accommodation items and the upper side covering the accommodation items.

Alternatively, the upper side may be described as a first side, the bottom side as a second side opposite the first side, and the edge as the intermediate area between the first and second sides, with the edge typically extending substantially perpendicular to the first and/or second sides. However, in order to facilitate the comprehension of the present invention and to approximate the present invention to a typical description, terms such as upper side, lower side, and circumferential edge will be used below as explained above. Also, the edge may have a height of 0, so that in this case the upper side will directly bear on the lower or bottom side, for example in the case where the functional area merely includes a thin functional layer.

The upper side of the cavity can then be formed by a top layer such as a substrate, sheet (wafer) or platelet. Furthermore, for example, the circumferential edge of the cavity may be formed by the top layer projecting downward or by the lower layer projecting upward, for example by having the lower layer abrasively hollowed out. The bottom of the cavity can finally be formed by a lower layer, a substrate, sheet (wafer), or platelet and can be arranged below the upper layer.

The cavities are in particular provided in the form of accommodation cavities. This means that electronic circuits, sensors, MEMSs or MOEMSs can be integrated in the respective cavities, for example. These aforementioned devices such as in particular electronic circuits, sensors, or MEMSs will therefore be enclosed by the package all around, i.e. on all sides thereof, since they are arranged inside the accommodation cavity.

The at least two substrates or the base substrate and the cap are arranged or attached to one another such that they come to lie flat against one another without any other sheets, layers, or inclusions present between the at least two substrates or between the base substrate and the cap. For technical reasons, there might be unavoidable minor gas inclusions between the layers in the contact areas, which may be caused by some possible unevenness. The amount of gas trapped in the 2-dimensional contact area can be further reduced by increasing the pressure, for example, such as in particular by pressing the substrate layers, or by a surface treatment in particular of the contact surfaces, such as a grinding process. Prior evacuation is beneficial. Filling with a type of gas or else with a liquid may also be advantageous, depending on the process parameters and the materials to be employed.

In other words, the substrate layers or the base substrate and the cap are stacked directly and in direct contact to each other, i.e. arranged so as to adjoin each other. Foreign materials are excluded as far as possible between the substrate layers, so that the most cohesive surface contact possible is created between one substrate layer and the adjoining substrate layer. In the case of two substrates, for example, the base substrate is arranged in direct contact to the cover substrate, in particular without any other materials or any spacing between the base substrate and the cover substrate. In the example of more than two substrates, the base substrate is arranged directly adjoining the one or the first one of the intermediate substrate layer(s), the cover substrate in turn is arranged directly adjoining the one or the last one of the intermediate substrate layer(s). In the example of base substrate and cap, these are arranged so as to adjoin each other, with the cap having the contact surfaces on its end faces, where a direct, immediate and optionally full-surface contact is established between the end faces of the cap and the base substrate.

Then, the substrates are joined together using the novel laser welding process. In this case, a planar substrate layer is directly joined or bonded to the immediately adjoining planar substrate layer or planar end face without providing or requiring any foreign material or non-planar material or intermediate layers for this purpose. That is, the substrates are bonded directly to one another. The laser bonding line introduced into the two-dimensional contact area between two substrate layers bonds the directly adjoining substrate layers to one another, i.e. directly adjacent to one another, in a non-releasable manner. The fused zone of the laser bonding line is therefore present in both substrates and seamlessly extends from the first substrate into the immediately adjoining second substrate, that is, for example, from the base substrate into the cap.

Thus, a direct two-dimensional or even full-surface transition is formed from one substrate layer to the next substrate layer, i.e. a substrate-to-substrate transition or a glass-to-glass transition, for example. A locally limited volume in the form of a welding zone or laser bonding line is created, which includes material transferred or mixed between the adjoining substrate layers which in particular have a sheet-like shape. In other words, material of the first substrate, for example the cover substrate, penetrates into the adjoining substrate, for example the intermediate substrate or the base substrate, and vice versa, i.e. material from the adjoining substrate penetrates into the first substrate, so that the welding zone includes a complete mixture of material from the adjoining substrates. The welding zone can therefore also be referred to as a convection zone.

The novel laser welding technique for producing the non-releasable glass-to-glass transition or substrate-to-substrate transition is particularly advantageously free of intermediate layers, glass frits, foils, or adhesives that had to be introduced between the substrates in earlier prior art processes. Rather, the non-releasable bond can be produced without such interfering intermediate layers or additional materials. This saves the use of additional materials, increases the achievable strength of the end product, and enables reliable hermetic sealing of the functional area or of the cavity/cavities. The laser welding zone can be identified in the finished end product, for example by the specific local change in the refractive index of the materials in the small fusion area.

Optionally, a gap that might arise between the substrates or between the base substrate and the cap has a width of less than or equal to 5 μm, or less than or equal to 1 μm. Such a gap arises, for example, due to tolerances in the substrate manufacturing, by thermal impacts or by inclusions of particles such as dust. Even with such a tolerable spacing which is still considered to be immediately adjoining in the context of the present invention, it is possible to laser weld in such a manner that the welding zone is between 10 and 50 μm in thickness so that a hermetic seal is ensured. Again, in this case, the welding zone extends from the first substrate into the second substrate adjoining the first substrate. Thus, the welding zone is introduced in the contact area between the first and second substrates and directly fuses the substrates to one another to form an inseparable bond. In other words, when the adjoining substrates are bonded in the welding zone, material of both substrates is directly melted in the welding zone, and the material of the first substrate mixes with the material of the second substrate to form an inseparable integral bond. The package produced in this way therefore includes an integral, i.e. monolithic bond between the substrates in the welding zone.

A contact area does not have to be optically transparent. It is also advantageous if the transparent substrate or the transparent cap is opaque in the visible wavelength range. Only the substrate through which the laser passes to reach the contact area has at least one spectral "window" such that at least the wavelength of the employed laser can be transmitted through the substrate at least partially or at least in sections thereof. The contact area is adapted such that the laser is able to deposit energy there. For example, the surfaces of the two adjoining substrates may be joined by optical contact bonding and may furthermore optionally exhibit a roughness in the nanometer range. The laser radiation will at least partially be absorbed at this interface, so that energy can be introduced there. In the sense of the present application, contact area is generally understood to mean an interface at which the incident laser beam can deposit energy so that a bonding process can be performed along the contact area. A simple case of such an interface is the contact area between the cap and the base substrate. The substrates are bonded or joined to one another in order to form a joint package and to hermetically seal the cavities.

The step of hermetically sealing the package is achieved by bonding along the at least one contact area of each package by a laser welding process. In other words, a laser can be used to deposit energy in the contact area, in particular locally limited to such an extent that it can be referred to as a cold welding process. That is, the thermal energy provided for the bonding is focused to the extension of the laser bonding line and only comparatively slowly diffuses into the rest of the material of the package, so that in particular no significant temperature rise will occur inside the cavity. This protects the electronics disposed in the cavity from overheating.

The laser is used to locally melt material of the two substrates or the cap along the laser bonding line, so that the at least two substrates are bonded locally. For this purpose, a person skilled in the art may refer to Applicant's EP 3 012 059 B1, for example, which is hereby incorporated by reference.

A particular advantage of a transparent package made of glass or predominantly made of glass, in particular borosilicate glass, is its chemical inertness.

The one or more substrate(s) may also have a coating. For example, AR coatings, protective coatings, bioactive films, optical filters, conductive layers such as made of ITO or gold may be employed, as long as it is ensured that transparency or at least partial transparency for the employed laser wavelength is provided in the irradiation area of the laser.

The at least one transparent substrate is optionally made of glass, glass ceramics, silicon, or sapphire, or of a combination of the aforementioned materials, i.e., for example, glass/silicon, a glass/silicon/sapphire combination, or a silicon/sapphire combination. The one or more further substrate(s) may also include or consist of $Al_2O_3$, sapphire, $Si_3N_4$, or AlN. Combining a transparent substrate with a different type of substrate allows to obtain semiconductor properties, for example. Coatings may also be employed, for example piezo-resistive Si layers, in particular for pressure sensors, or thicker layers for micro-mechanical applications such as pulse measurement via an MEMS.

In this case, at least one of the lateral circumferential edge, the bottom, or the upper side are transparent for some range of wavelengths, at least in sections thereof. In other words, it is sufficient if at least one component of the package is transparent for optional wavelength range at least in a portion of the component, the wavelength range being known in advance so that the material can accordingly be adapted to the wavelength of the laser to be used, if desired.

The package is joined using a laser welding process to form the hermetically sealed package. In other words, the edge, bottom, and upper side initially include or consist of more than one piece, for example of two or three parts or even more, and the parts are laser-welded to one another to complete the package.

In a further embodiment, the package may be chemically toughened at least partially and/or in sections thereof. For example, one surface of the package is chemically toughened, i.e. for example the upper side. It is also possible that the upper side and the edge are chemically toughened. Optionally, the upper side and the edge and the lower side are chemically toughened, so that the respective surface of the upper side and the lower side as well as the respective edge, i.e. the rim, is chemically toughened.

Prior to the step of producing the laser bonding line for joining along the contact areas of each package, the substrates may be bonded to one another at least temporarily by optical contact bonding.

The present invention will now be explained in more detail by way of exemplary embodiments and with reference to the figures in which identical and similar elements are partially denoted by the same reference numerals, while the features of the different exemplary embodiments can be combined with each other.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 1a is a view of the opened accommodation cavity from above;

FIG. 1b is a perspective view of a sealed package;

FIG. 1c shows an alternative open package;

FIG. 1d is a sectional view through the welding zone;

FIG. 9 is a sectional view along line C-D of yet another embodiment of the package as shown in FIG. 2;

FIG. 10 is a sectional view along line C-D of yet another embodiment of the package as shown in FIG. 2;

FIG. 11 is a sectional view along line C-D of yet another embodiment of the package as shown in FIG. 2;

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 2:
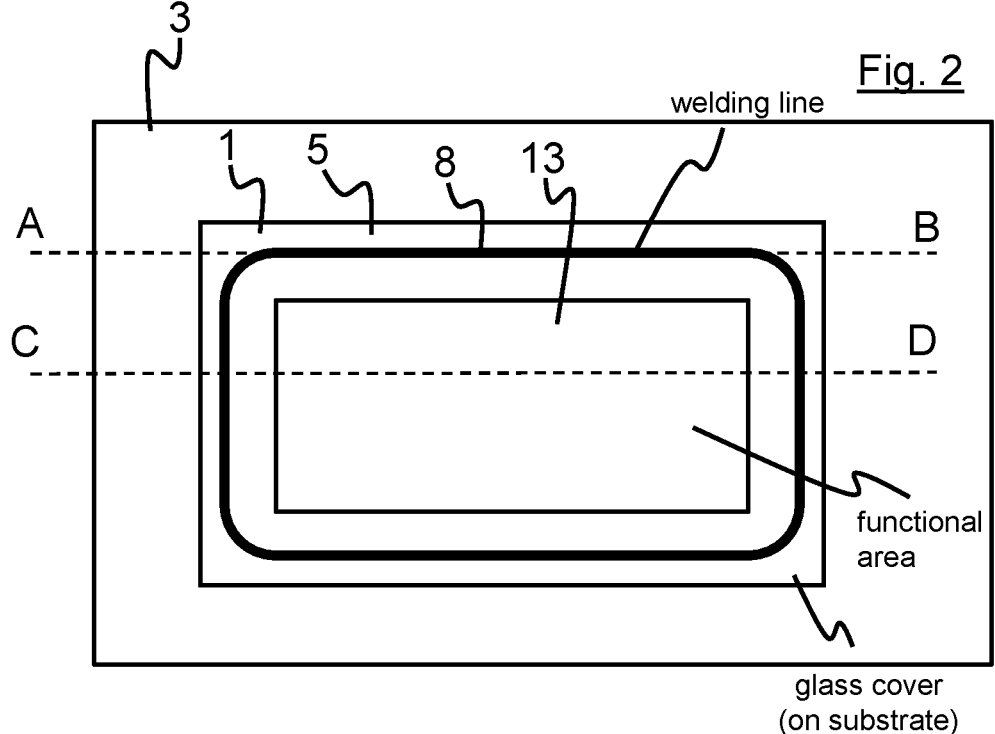
FIG. 2 shows a plan view of a package on a base substrate.

FIG. 1a shows the accommodation item 2 to be protected, introduced in a base substrate 3 such as a wafer or a printed circuit board, in particular one made of aluminum nitride. Functional area 13 is in the form of a recess in the base substrate 3, as made by an abrasive process such as a sandblasting process, for example. In other words, the base substrate 3 has a recess 13 in which the accommodation item 2 is placed. So, base substrate 3 includes a portion 3a which defines the bottom 22 of package 1. In other words, the package 1 is formed with a portion of the substrate 3 as the bottom 22 (see FIG. 6), and the package 1 is firmly connected, in particular joined, to the substrate 3. A cap 5 is shown, which is intended for covering the accommodation item 2. Cap 5 may be a glass plate, for example, which is placed on the recess 13 in the base substrate 3. Thus, the components 3 and 5 jointly define the package 1 around accommodation item 2 which is arranged in the functional area 13, here a cavity 12 (see FIG. 1c), when the package 1 is closed. In other words, when the cap 5 is placed on the base substrate 3 in the example of FIG. 1a, a closed accommodation cavity 12 is formed, which will have to be hermetically sealed in a subsequent step.

FIG. 1b shows the created hermetically sealed package 1 which was joined by a laser welding process. The package includes the cap 5 stacked on top of the base substrate 3, thereby forming a contact area 25 between cap 5 and substrate 3, along which a laser bonding line 8 has been introduced.

FIG. 1c shows a further embodiment of the package 1, in which the cap 5 includes a top portion 5b and a circumferential skirt 5a. Cap 5 is placed on the substrate 3, with the contact area on the end face of circumferential skirt 5a, specifically in the area of the underside 3a of the package 1, which will then form the bottom 22 (see FIG. 6) of the cavity 12 when the package 1 is completed.

FIG. 1d shows a detail of the joining area, clearly illustrating the interface zone, i.e. the contact area 25 and the laser welding zone 8. Laser welding zone 8 is located in contact area 25.

FIG. 2 shows a plan view of a package 1 according to the invention, with the circumferential laser welding zone 8 surrounding the functional area 13. Functional area 13 may be implemented in different ways. Exemplary embodiments of functional area 13 as well as for other options of a package can be seen in FIGS. 3 through 13. The various designs of functional area 13 can all be schematically illustrated as in FIG. 2, as they will be similar in such a plan view. Lines A-B and C-D indicate section lines along which the sectional views of FIGS. 3 to 13 are reproduced.

The functional area may implement various tasks, for example it may include an optical receiver or a technical, electro-mechanical, and/or electronic component which is disposed in the functional area 13. It is also possible to implement a plurality of such tasks in the functional area 13. On the upper side, the package 1 is covered by upper substrate 5 or cap 5. The laser welding zone 8 extends into this upper substrate 5.

Figure 3:
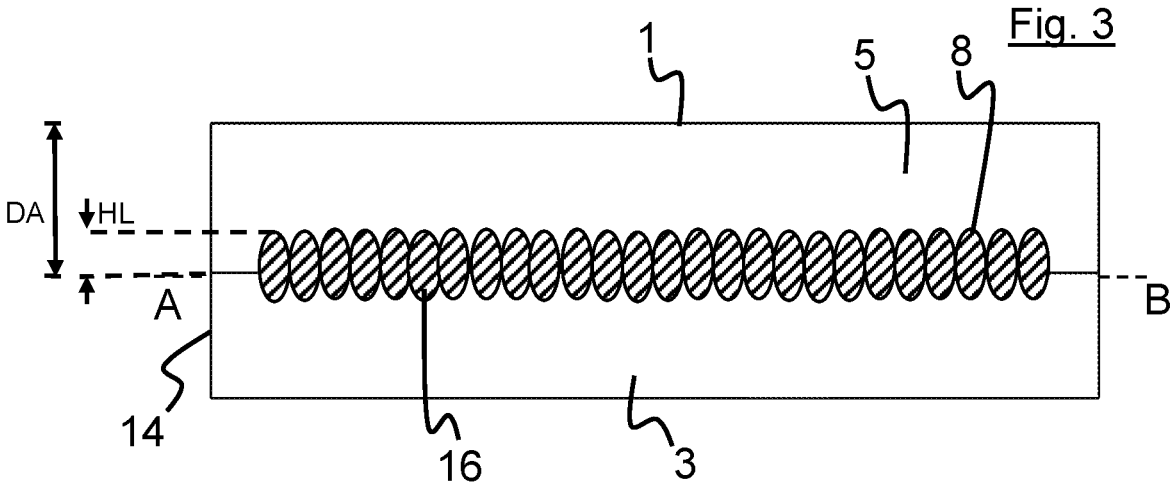
FIG. 3 is a sectional view along line A-B of an embodiment of a package as shown in FIG. 2.

Referring to FIG. 3 which shows a first sectional view of a first embodiment of a package 1, which includes a base substrate 3 and a flat cap 5 in the form of a cover substrate 5. In other words, package 1 is made of or composed of two layers, namely base layer 3 and cover layer 5. FIG. 3 also shows the structure of laser welding line 8 in the form of a string of multiple laser pulse impact areas 16 which are placed so close to one another that the material of the base substrate 3 and of the cover substrate 5 seamlessly fuses to one another thereby hermetically sealing the functional area 13 or the cavity 12.

Figure 4A:
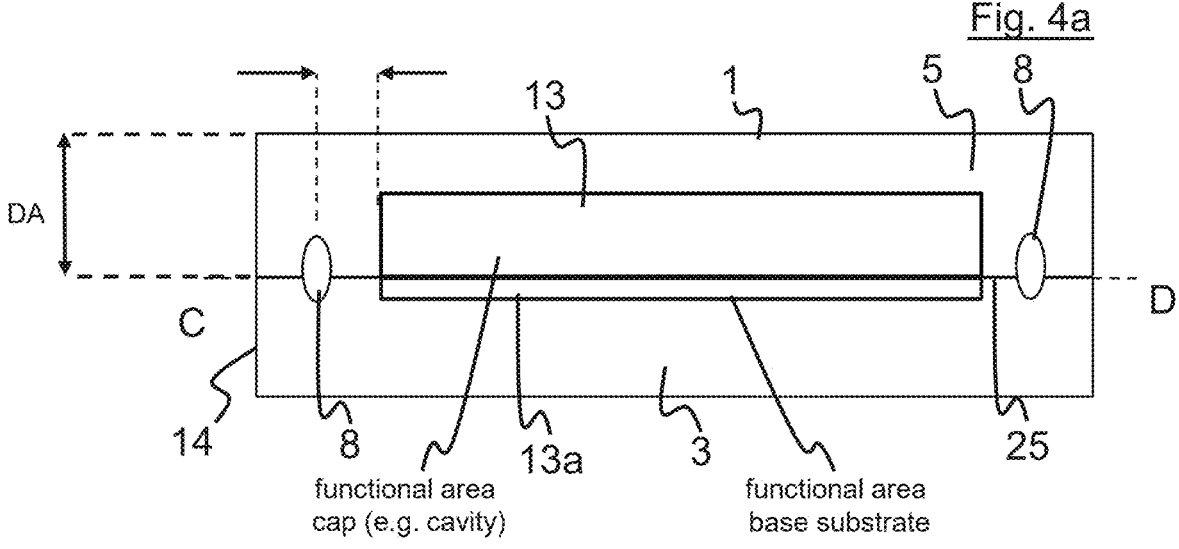
FIG. 4a is a sectional view along line C-D of another embodiment of the package as shown in FIG. 2.

FIG. 4a shows a sectional view of an embodiment of a package 1 along line C-D as shown in FIG. 2. FIG. 4a furthermore shows a section through the functional area 13, 13a which extends inside the package 1, for example in the form of a continuous hollow space or cavity. In other words, the cavity extends from base substrate 3 into the cover substrate 5 and, for example, is in the form of a recess made in the base substrate 3 and/or in the cap 5. For example, the functional area 13a may also include an active layer such as an electrically conductive layer, and the functional area 13 includes the cavity. The laser welding zone 8 provided circumferentially around the functional area 13, 13a seals the functional area 13, 13a all around along the lateral sides thereof. It is conceivable to leave gaps in the laser welding zone 8 so that the functional area 13, 13a will not be sealed all around, for example in order to keep open a communication channel or space for an electrical connection, which may however also be used to establish fluid communication with the environment, for example. In other words, it might be contemplated to not seal predefined locations or points using the focused laser beam 9, but to rather achieve a hermetic seal by other means there, such as by an adhesive. Optionally, the functional area 13, 13a is sealed along all of its sides and without any gaps.

Figure 4B:
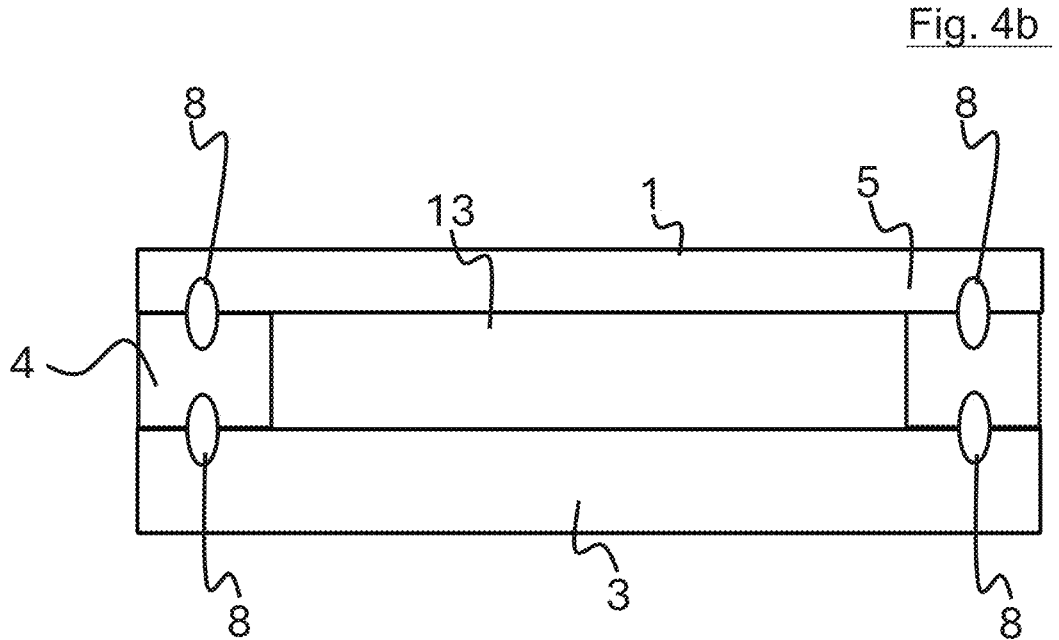
FIG. 4b is a sectional view along line C-D of yet another embodiment of the package as shown in FIG. 2 but with the package including an intermediate substrate and two laser welding zones.

In FIG. 4b, a package 1 includes an intermediate substrate 4 which is arranged between the heat-dissipating base substrate 3 and the cap 5, and in this example the base substrate 3 is joined to the intermediate substrate 4 in a first bonding plane by at least one first laser bonding line 8, and the cap 5 is joined to the intermediate substrate 4 in a second bonding plane by at least one second laser bonding line 8. Further, the cap 5 may define the upper side of the functional area 13 or cavity, the intermediate substrate 4 may define the laterally circumferential edge, and the heat-dissipating base substrate 3 may define the bottom of the functional area 13 or cavity, which together completely enclose the accommodation cavity.

Figure 5:
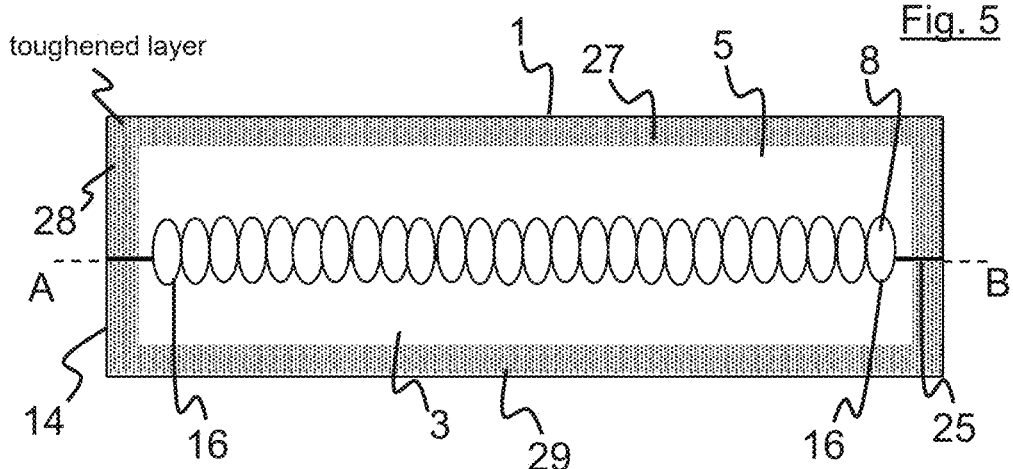
FIG. 5 is a sectional view along line A-B of yet another embodiment of the package as shown in FIG. 2.

Referring to FIG. 5 which shows a further embodiment in which incident laser pulses 16 create the laser welding zone 8 where the cover substrate 5 is welded or joined to the base substrate 3 along contact area 25. This embodiment has the further special feature to have the surfaces of the first substrate 3 and of the second substrate 5 toughened all around, that is to have toughened layers 27, 28, and 29. For example, the cap 5 can be dipped into a toughening bath with its upper side before being bonded to the base substrate 3, or else after having been bonded to the base substrate 3, so that the finished package 1 will be chemically toughened, i.e. will have at least one toughened surface 27 and/or has at least one toughened layer. In other words, the finished package 1 is toughened at least in sections thereof or at least partially, in particular chemically toughened. With the chemical toughening, a compressive stress is established on the cover substrate 5.

In the embodiment shown in FIG. 5, the package 1 is toughened on all outer surfaces, i.e. both the two opposite major surfaces have toughened layers 27 and 29, and the circumferential edge 14 of the package has a toughened layer 28, the circumferential edge 14 extending circumferentially around the package 1. In other words, in the case of a cuboid package, all four narrow sides that are found on a cuboid jointly form the edge 14. The edge 14 can also be understood or referred to as an edge 21 of the package, which extends around the cavity. A package 1 as shown in FIG. 5 can be obtained, for example, by immersing the finally welded package including the cap 5 and the base substrate 3 in a toughening solution and in particular chemically toughening it there. The toughened layers 27, 28, 29 are thus disposed directly at the outer surfaces of the package 1. Thus, inwards of the toughened layers 27, 28, 29 there remains an area for the welding line 8 which is possibly introduced with a spacing to the toughened layers 27, 28, 29.

Figures 6, 7, 8:
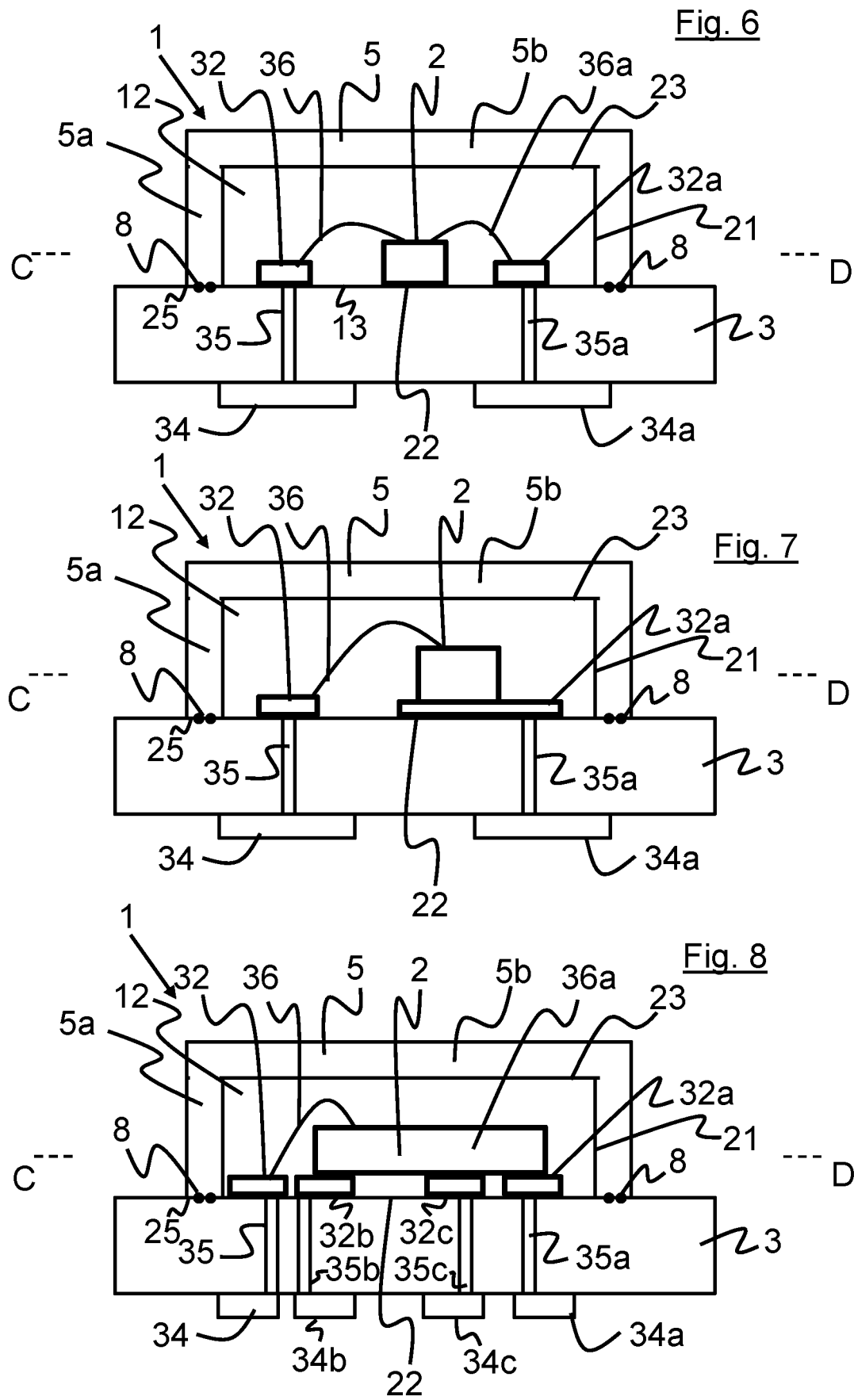
FIG. 6 is a sectional view along line C-D of yet another embodiment of the package as shown in FIG. 2.
FIG. 7 is a sectional view along line C-D of yet another embodiment of the package as shown in FIG. 2.
FIG. 8 is a sectional view along line C-D of yet another embodiment of the package as shown in FIG. 2.

FIG. 6 shows an embodiment of the package 1 comprising a cap 5 having a skirt 5a placed on the base substrate 3. The view of FIG. 6 may correspond to a section along line C-D as shown in FIG. 2. In this embodiment, the functional area 12, 13, 13a is designed so as to be provided on the base substrate 3 and to extend into the cap 5. Welding line 8 is provided around the cavity 12 so that the cavity 12 is hermetically sealed on all sides thereof. Cap 5 may be round or square and may in principle be of any free shape.

The accommodation item 2, for example a sensor or actuator, is arranged on the bottom 22 of cavity 12, for example glued thereto. Metallic pads 32, 32a for making electrical contact with the accommodation item 2 are provided on either side of the accommodation item. Contacting wires 36, 36a such as bond wires, for example, electrically connect the accommodation item 2 with the contact points 32, 32a. The contact points 32, 32a may be metallic contact areas. Connectors 35, 35a establish an electrical connection to second contacts 34, 34a that are arranged outside cavity 12, so that the accommodation item on base substrate 3 such as a printed circuit board 3 can be contacted from outside. In the present example, the second contacts 34, 34a are arranged on the underside or lower surface of the base substrate 3, thereby allowing the size of the individual package 1 to be kept small. It has to be ensured that the contacting wires 36, 36a are hermetically sealed, for example by applying the second contacts 34, 34a directly on the connectors 35, 35a. The cap 5 is directly joined to the base substrate 3 by laser bonding lines 8. In the present case, two closed circumferential laser welding zones 8 were formed by directing the laser 9 twice around the cavity along contact area 25 or along the outer edges of cap 5, but not on an exactly identical path. Rather, with each revolution around the cavity 12 the laser 9 was directed along a laterally offset path so that two laser welding zones 8 are created next to one another. For example, the micro-welding zones 8 in the present example have dimensions of 5 μm×10 μm or 10 μm×50 μm.

For example, AF45 may be used as the material for the cap 5. The base substrate 3 may include an AlN ceramic of single-layer design. This is advantageous if cost-efficient fabrication is desired, for example for power semiconductors or for LEDs. The characteristic value of the coefficient of thermal expansion (CTE) of the two in particular different materials of the cap 5 and the base substrate 3 can be selected so as to be matched to one another between the layers. For example, the CTEs may be similar or even identical, in order to have little or no thermal stress at all in the package 1. The CTEs of AF45 and AlN match surprisingly well for the desired application; hardly any thermal stress was determined on the package 1. $Si_3N_4$ may also be employed as the material for the base substrate. A special feature of the package 1 according to the invention is that the substrate 3 is a highly thermally conductive material, in the embodiments of FIGS. 6-9 and 13 in the form of a single-layer ceramic, in the embodiments of FIGS. 10-12 in the form of a multi-layer ceramic.

FIG. 7 shows a further embodiment of a package 1 along section line C-D, and in this example, again, the functional area 13 or cavity 12 is provided inside the cap 5. In this example, the accommodation item 2, such as a high power LED, has an upper side contact area and a lower side contact area. Thus, the accommodation item 2 is arranged on contact 32a and is directly electrically connected thereto. A second electrical connection is established between contact 32 and the upper side of accommodation item 2 via contacting wire 36. Cap 5 is fused and hermetically sealed to the base substrate 3 by bonding lines 8. In all embodiments, the same reference numerals denote the same features in the figures.

The joint along bonding line 8 was optionally introduced into relaxed, i.e. non-toughened material of the cap 5 and of the base substrate 3. The base substrate 3 is joined directly to the cap 5, so that no further layer or no further substrate is arranged between the base substrate 3 and the cap 5. The functional area 13 is in the form of a cavity 12. AF45 or 8337b can be used as the material for the cap 5, for example, and the base substrate 3 may be a single-layer or multi-layer AlN ceramic. The vias or contacting feedthroughs 35, 35a are filled, i.e. in particular hermetically sealed.

Referring to FIG. 8 which illustrates a further embodiment of the package 1, in which a plurality of contacts 32, 32a, 32b, 32c are provided inside the cavity and are extended to the second contacts 34, 34a, 34b, 34c outside package 1 via feedthroughs 35, 35a, 35b, 35c. The second contacts 34, 34a, 34b, 34c are arranged on the underside of base substrate 3 in this example. The accommodation item, for example a microprocessor or a power transistor, may have contacts on the lower and upper surfaces thereof. In this example, the microprocessor has three contacts on its lower surface, and the microprocessor 2 is directly supported on the three contacts 32a, 32b, 32c, and the upper surface contact is connected to the contact 32 via contacting wire 36. Cap 5 and base substrate 3 are hermetically joined to one another by two laser bonding lines 8.

FIG. 9 shows an embodiment of the package 1 in which the accommodation item 2 only has contacts on the underside thereof. The accommodation item 2 can then be simply placed directly on the contacts 32, 32a, dispensing with the contacting wires 36, 36a.

FIG. 10 shows an embodiment of the package 1 in which the second contacts 34, 34a are disposed on the upper surface of the base substrate 3 and laterally of the package 1. Although the surface area of the base substrate 3 required for each package 1 is larger in this embodiment, resulting advantages are, on the one hand, that the electrical connection of the second contacts 34, 34a can be made from above, which may be easier. Moreover, no bore will be made in the base substrate 3, so that hermetic sealing can be achieved more easily if the base substrate as such is expected to ensure hermetic sealing. This embodiment may be advantageous in a case, for example, where a plurality of packages 1 are arranged on a common base substrate 3 (see FIG. 12), or if the contacts are intended to be electrically connected later. It will be appreciated that more than 4 contacts may be provided, which may also be arranged only on the underside of the accommodation item 2, or distributed on the underside and on the upper surface, or may be arranged on the underside and/or on the upper surface of the base substrate 3. AlN can be used as the material of the base substrate, in a single-layer or multi-layer design, and $Si_3N_4$ can also be used. FIG. 11 shows a further embodiment with second contacts 34, 34a arranged on the upper surface, with the accommodation item 2 being disposed on the contact 32a and electrically connected with contact 32 via contacting wire 36.

Figures 12, 13:
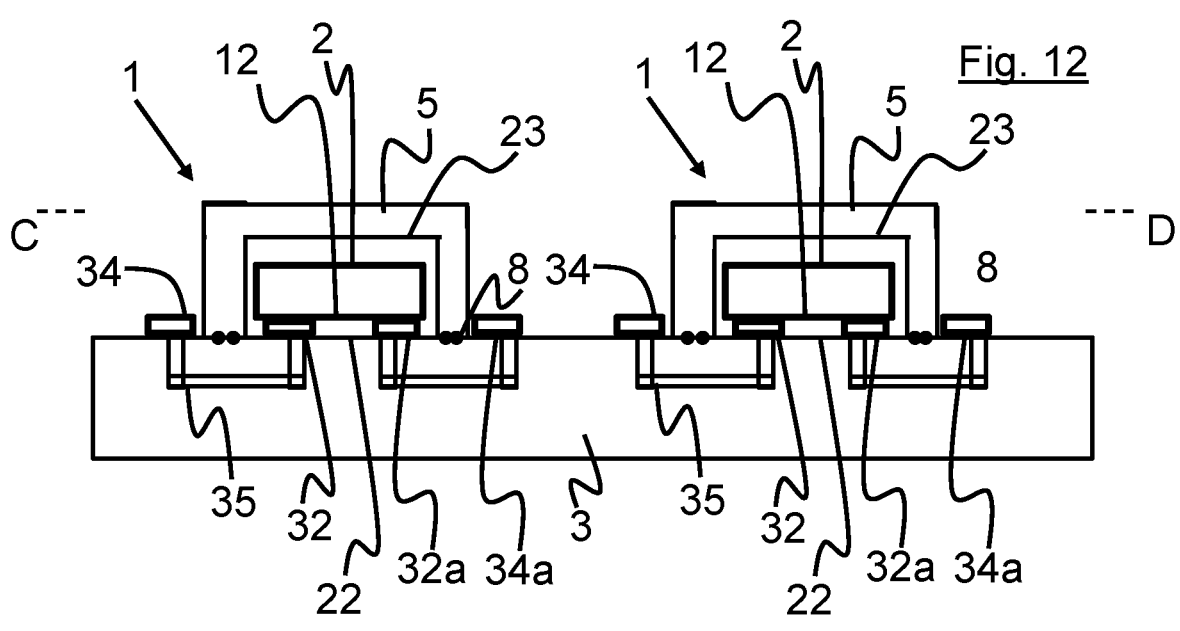
FIG. 12 is a sectional view along line C-D of yet another embodiment of the package as shown in FIG. 2.
FIG. 13 is a sectional view along line C-D of yet another embodiment of the package as shown in FIG. 2.

Referring to FIG. 12 which shows a shared base substrate 3 on which two bottom areas 22 of two packages 1 are defined. Each package 1 has one accommodation item 2 placed on the base substrate 3, and the accommodation items are electrically connected to the exterior to the respective second contacts 34 and 34a. Given the type of embodiment as in FIG. 12 it will be appreciated that a shared base substrate 3 may also include a plurality of packages 1 which may optionally perform common tasks, that is they may be electrically connected to one another.

FIG. 13 shows an embodiment of the package 1 in which a cavity 12 is introduced into the base substrate 3. For example, the cavity 12 may be introduced into the base substrate 3 by a sandblasting process, i.e. may be recessed in the base substrate 3, more generally by using an abrasive process. Chemical etching is another option for introducing the cavity 12 into the base substrate 3. An advantage of this embodiment is that the cap 5 can be made in the form of a simple glass sheet, for example, which is joined to the basic substrate 3 by micro-bonding and laser bonding lines 8. Again, AlN can be used as the material of the base substrate

3, or else High Temperature Cofired Ceramics (HTCCs). In the case of a multi-layer ceramic, the making of the cavity 12 has proven to be particularly easy to implement if these cavities 12 have already been produced in the green state, for example by a stamping process.

Figure 14:
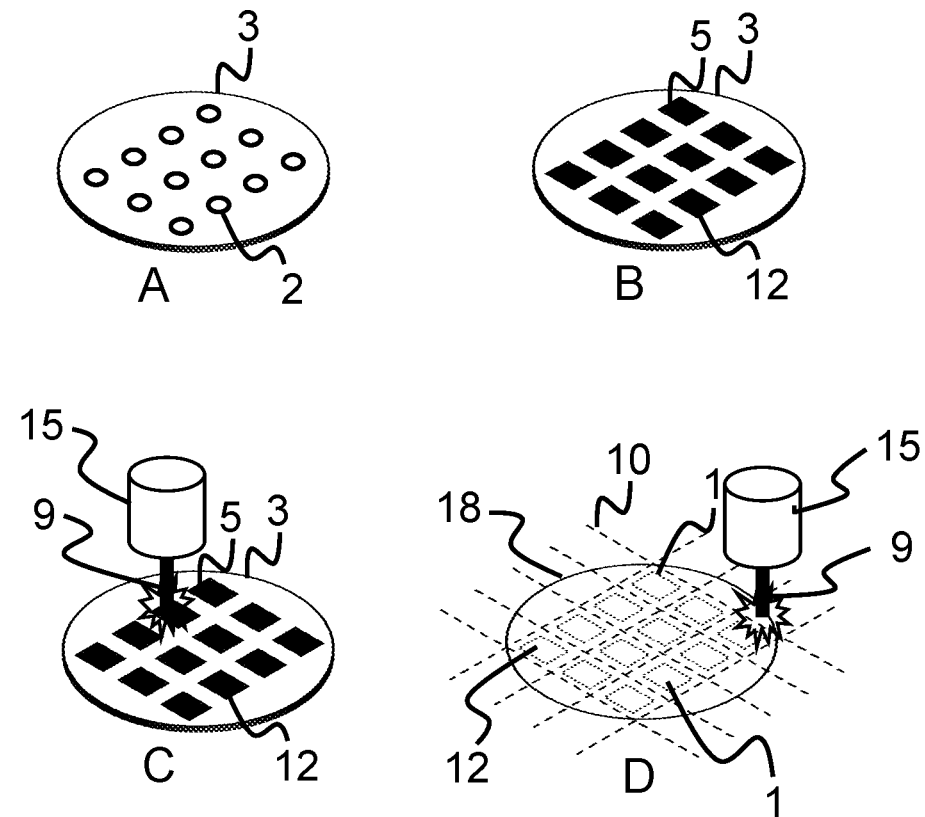
FIG. 14 shows steps of a method for producing a package.

Referring to FIG. 14 which shows an embodiment of the method for producing a plurality of packages 1 on the substrate 3. It will be obvious to a person skilled in the art that it is equally possible to only mount a single package or a single cap 5 on a substrate, depending on the process requirements. With regard to the process sequence, such a method for mounting a single cap 5 on a substrate 3 would ultimately be a simplification of the method illustrated here by way of FIG. 14.

In a step A, a plurality of accommodation items 2 are placed on the base substrate 3, for example soldered to provided contacts 32, 32a (see FIG. 3). It is intended to mount a cap 5 over each accommodation item 2, i.e. to produce a separate cavity 12 for each accommodation item 2. However, it is also possible to accommodate a plurality of accommodation items 2 in a common cavity 12 using a shared cap 5.

In step B, the glass caps 5 are placed on the base substrate 3 so as to completely form the cavities 12.

Step C shows the laser welding of the respective accommodation cavities 12, i.e. the sealing of the cavities 12 all around along contact areas 25 and the introduction of the at least one laser bonding line 8 per package 1. For this purpose, a laser unit 15 is directed over the surface of the substrate 3 from above the caps 5, and a focused laser beam 9 is selectively directed to the zones to be joined, that is to the contact areas 25. Once step C of the manufacturing process has been completed, all of the cavities 12 will have been hermetically sealed. It is possible to separate the individual packages 1 from one another by a cutting process, after step C, so as to obtain individual separate packages.

In step D, the components are separated from one another along separation or cutting lines 10. Optionally, the same laser as for the laser welding in step C may be used for this purpose. However, a conventional cutting technique may also be employed, if this is advantageous. Step D shows wafer stack 18, which includes base substrate 3 and cap 5, which are shown in Steps A, B, and C of FIG. 14.

It will be apparent to a person skilled in the art that the embodiments described above are meant to be exemplary and that the invention is not limited thereto but may be varied in many ways without departing from the scope of the claims. Furthermore, it will be apparent that irrespective of whether disclosed in the description, the claims, the figures, or otherwise, the features individually define essential components of the invention, even if they are described together with other features. Throughout the figures, the same reference numerals designate the same features, so that a description of features that are possibly only mentioned in one or at least not in conjunction with all figures can also be transferred to such figures with regard to which the feature has not explicitly been described in the specification.

LIST OF REFERENCE NUMERALS

1 Hermetically sealed, chemically toughened package
2 Accommodation item
3 Lower substrate, layer, or wafer, base substrate, or lower cover, with good thermal conductivity
5 Upper substrate, layer, or wafer, cover substrate, or upper cover, optically transparent for laser bonding
8 Laser welding zone

9 Focused laser beam
10 Separation or cutting lines
12 Accommodation cavity
13 Functional area
13*a* Second functional area
14 Edge
15 Laser unit for welding and/or cutting
16 Laser pulse impact area
21 Edge of cavity
22 Bottom of cavity
23 Upper side of cavity
25 Contact area
27 Toughened zone or first toughened layer
28 Toughened zone or second toughened layer
29 Toughened zone or third toughened layer While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A hermetically sealed package, comprising:
   a heat-dissipating base substrate configured for dissipating heat from the hermetically sealed package;
   a cap arranged on the heat-dissipating base substrate, the cap and the heat-dissipating base substrate jointly forming at least a part of the package, the cap at least partially defining at least one functional area hermetically sealed by the package; and
   at least one laser bonding line configured for hermetically sealing the package, the at least one laser bonding line being associated with at least one of the cap and the heat-dissipating base substrate and having a height perpendicular to a bonding plane of the at least one laser bonding line, the heat-dissipating base substrate comprising a metallic nitride which is an aluminum nitride ceramic, the heat-dissipating base substrate being directly joined to the cap or to an intermediate substrate, the at least one laser bonding line extending into a material of the cap over the height and, on an opposite side of the at least one laser bonding line, extending into a material of the heat-dissipating base substrate or a material of the intermediate substrate, the at least one laser bonding line forming a hermetic seal, and the at least one laser bonding line circumferentially surrounding the at least one functional area at a distance therefrom.

2. The hermetically sealed package of claim 1, wherein at least one of:
   the heat-dissipating base substrate is made of the material having a high thermal conductivity; and
   thermal conductivity of the heat-dissipating base substrate is one of at least 100 W/(m*K), at least 150 W/(m*K), and at least 170 W/(m*K).

3. The hermetically sealed package of claim 1, wherein the cap comprises a vitreous material, which is one of a glass, a glass ceramic, a silicon, a sapphire, and a combination thereof.

4. The hermetically sealed package of claim 1, wherein at least one of:
   the cap is joined to the heat-dissipating base substrate by the at least one laser bonding line; and the cap and the heat-dissipating base substrate jointly and completely form the hermetically sealed package.

5. The hermetically sealed package of claim 1, wherein the hermetically sealed package is configured for accommodating at least one accommodation item which is one of an electronic circuit, an electronic circuit device, a sensor, and a micro-electromechanical system, wherein at least one of:
   the at least one functional area is adapted to accommodate the at least one accommodation item; and
   the at least one accommodation item is arranged on the heat-dissipating base substrate and inside the hermetically sealed package.

6. The hermetically sealed package of claim 5, wherein the at least one functional area is formed as a cavity, the at least one accommodation item comprising a power semiconductor chip, which is selected from the group consisting of a GaN light-emitting diode, a SiC power transistor, a GaAs power transistor, and a GaN power transistor, the power semiconductor chip being arranged inside the cavity.

7. The hermetically sealed package of claim 1, wherein at least one of:
   the cap is welded to the heat-dissipating base substrate at room temperature during a welding process, and wherein only a negligible amount of heat enters the at least one functional area due to the welding process; and
   an amount of heat generated by the welding process is kept away from the at least one functional area by the heat-dissipating base substrate.

8. The hermetically sealed package of claim 1, wherein the heat-dissipating base substrate and the cap are fused to one another.

9. The hermetically sealed package of claim 1, wherein the intermediate substrate which is arranged between the heat-dissipating base substrate and the cap,
   wherein the heat-dissipating base substrate is joined to the intermediate substrate in a first bonding plane, and the cap is joined to the intermediate substrate in a second bonding plane.

10. The hermetically sealed package of claim 9, wherein the at least one functional area is formed as an accommodation cavity, wherein at least one of:
   the cap defines an upper side and a laterally circumferential edge of the at least one functional area, and the heat-dissipating base substrate defines a bottom of the at least one functional area, which together completely enclose the accommodation cavity; and
   the cap defines an upper side of the at least one functional area, the intermediate substrate defines a laterally circumferential edge of the at least one functional area, and the heat-dissipating base substrate defines a bottom of the at least one functional area, which together completely enclose the accommodation cavity.

11. The hermetically sealed package of claim 10, wherein the hermetically sealed package formed by at least one of the laterally circumferential edge, the bottom, and the upper side is at least partially transparent for a wavelength range.

12. The hermetically sealed package of claim 1, wherein at least one of the heat-dissipating base substrate and the cap has a thickness of one of less than 500 μm, less than 300 μm, less than 120 μm, and less than 80 μm.

13. The hermetically sealed package of claim 1,
   wherein the heat-dissipating base substrate defines a bottom of the at least one functional area,
   wherein the heat-dissipating base substrate has at least a first contact and a second contact, and wherein the first contact is disposed on the bottom of one of the at least one functional area and a cavity which the at least one area forms.

14. The hermetically sealed package according claim 13, wherein the second contact is (a) disposed outside the bottom of one of the at least one functional area and the cavity and (b) electrically connected to the first contact.

15. The hermetically sealed package of claim 1, wherein at least one of:

wherein the hermetically sealed package has a size of one of no more than 10 mm×10 mm, no more than 5 mm×5 mm, no more than 2 mm×2 mm, and no more than 0.2 mm×0.2 mm;

wherein the cap has a height of no more than 2 mm; and wherein a skirt of the cap has a height of no more than 2 mm.

16. The hermetically sealed package of claim 1, wherein the hermetically sealed package is produced by a method which includes the steps of:

providing that the cap is transparent at least in some portions thereof for at least one wavelength range and therefore is a transparent cap, the at least one functional area including a hermetically sealed accommodation cavity enclosed in the hermetically sealed package, the at least one functional area being surrounded by a laterally circumferential edge, a bottom, and an upper side of the hermetically sealed package, the accommodation cavity being configured for accommodating an accommodation item;

arranging at least one of the accommodation item on the bottom of the accommodation cavity;

arranging the cap on the heat-dissipating base substrate above the accommodation item and thereby creating at least one contact area between the heat-dissipating base substrate and the cap so that the hermetically sealed package has the at least one contact area; and hermetically sealing the accommodation cavity by forming the at least one laser bonding line along the at least one contact area of the hermetically sealed package.

17. The hermetically sealed package of claim 16, wherein the hermetically sealed package is configured for being used as one of a medical implant, a sensor, and a barometer.

18. The hermetically sealed package of claim 1, wherein the cap defines an upper side of the at least one functional area, and the heat-dissipating base substrate defines a laterally circumferential edge and a bottom of the at least one functional area, which together completely enclose an accommodation cavity.

19. A method for providing the hermetically sealed package of claim 1, the method comprising the steps of:

providing a stack of substrates for forming at least one of the hermetically sealed package, the stack including the heat-dissipating base substrate and the cap, the cap being transparent at least in some portions thereof for at least one wavelength range and therefore being a transparent cap;

arranging an accommodation item on a bottom of an accommodation cavity;

arranging the cap on the heat-dissipating base substrate above the accommodation item and thereby creating at least one contact area between the heat-dissipating base substrate and the cap so that each one of the hermetically sealed package has the at least one contact area; and hermetically sealing the accommodation cavity by forming the at least one laser bonding line along the at least one contact area of each one of the hermetically sealed package, the hermetically sealed package enclosing the at least one functional area including a cavity, the at least one functional area being surrounded by a laterally circumferential edge, a bottom, and an upper side of the hermetically sealed package, the cavity being the accommodation cavity which is configured for accommodating the accommodation item.

20. The method of claim 19, wherein the cap comprises a skirt and a top portion, so that the top portion of the cap defines the upper side and the skirt defines at least a part of the laterally circumferential edge of the accommodation cavity; and wherein the at least one contact area is defined on an end face of the skirt.

21. The method of claim 19, wherein a laser beam is directed around the at least one functional area to form the at least one laser bonding line so that the at least one functional area is hermetically sealed circumferentially along the at least one contact area;

wherein at least one of (a) the laser beam is directed circumferentially around multiple times and (b) a plurality of laser bonding lines are formed.

22. The method of claim 19, wherein a plurality of bottoms are defined on the heat-dissipating base substrate for a plurality of accommodation cavities to be provided; and wherein a plurality of caps are applied to the heat-dissipating base substrate to form a plurality of hermetically sealed packages with respect to the heat-dissipating base substrate.

* * * * *